United States Patent [19]

Fottler

[11] 3,717,742

[45] Feb. 20, 1973

[54] METHOD AND APPARATUS FOR FORMING PRINTED CIRCUIT BOARDS WITH INFRARED RADIATION

[75] Inventor: Stanley A. Fottler, Glen Ellyn, Ill.

[73] Assignee: Circa Tran. Inc., Glen Ellyn, Ill.

[22] Filed: June 26, 1970

[21] Appl. No.: 50,221

[52] U.S. Cl. .......... 219/85, 29/626

[51] Int. Cl. .......... B23k 1/02

[58] Field of Search .......... 219/85, 347, 349, 354, 411; 174/52.5; 29/498, 626

[56] References Cited

UNITED STATES PATENTS

| | | | |
|---|---|---|---|
| 3,486,004 | 12/1969 | Morrone | 219/85 X |
| 3,583,063 | 6/1971 | Growney | 219/85 X |
| 3,486,223 | 12/1969 | Butera | 29/626 |
| 3,205,572 | 9/1965 | Jochems | 219/85 X |
| 3,497,947 | 3/1970 | Ardezzone | 174/52.5 X |
| 3,374,531 | 3/1958 | Bruce | 29/498 |

*Primary Examiner*—C. L. Albritton
*Assistant Examiner*—L. A. Schutzman
*Attorney*—Hibben, Noyes & Bicknell

[57] ABSTRACT

The printed circuit board includes a base made of an infrared radiation transparent material and, on one side of the base, electrical conductors. Between the base and the electrical conductors is an infrared radiation-absorbing interface. The interface and the conductors are bonded to the base by pressure and heat or by heating the board with infrared radiation transmitted through the base and onto the interface which converts the infrared radiation to heat to complete the bonding cure cycle. Electronic components having leads shaped as supporting feet may be reflow soldered to the conductors by similarly transmitting infrared radiation through the base onto the interface. The heat required for soldering is then carried by the conductors from the interface to the solder by thermal conduction. The components are not exposed to the infrared radiation, and no shields or special solders are needed to solder the components to the printed circuit board.

8 Claims, 7 Drawing Figures

Inventor:-
Stanley A. Fottler,
By Hibben, Noyes & Bicknell
Attys.

METHOD AND APPARATUS FOR FORMING PRINTED CIRCUIT BOARDS WITH INFRARED RADIATION

This invention relates to a method and apparatus for forming a printed circuit board and more particularly to a method and apparatus for bonding and soldering a printed circuit board assembly with infrared radiation.

The reflow solder technique has frequently been used in the past; see the D. A. Butera U.S. Pat. No. 3,486,223 issued Dec. 30, 1969. This technique comprises the steps of coating a conductor of a printed circuit board with solder, placing an electronic component on the conductor and reflowing the solder by heating it in order to secure the conductor and component together. The use of infrared radiation to reflow solder components to a printed circuit board is well known in the prior art; see the B. J. Costello U.S. Pat. No. 3,469,061, issued Sept. 23, 1969. In this prior method the infrared radiation is focused on the metal electrical conductors. Since the conductors have highly reflective surfaces, it was necessary to use a high intensity source of radiation which, if misdirected, tended to char or burn the board. Heretofore, radiation shields have been used to protect the components from damage by the radiation, and a special low-reflectivity solder cream was applied to the leads of the component, prior to heating. The use of radiation shield is cumbersome and requires increased assembly time, as does the use of a special solder cream.

The disadvantages of the prior art have been eliminated by the present invention which comprises a method and apparatus for curing a board and for soldering components on a printed circuit board using focused infrared radiation. The method and apparatus utilizes a printed circuit board having a sandwich construction or assembly including a base of an infrared radiation transparent material, an infrared radiation-absorbing interface, and an outer electrical layer or conductor which may be formed on, or bonded to, the base using infrared radiation as a heat source. The radiation-absorbing interface is provided to form a firm bond between the electrical conductor and the base, and when curing the board, the interface converts the radiation to heat which is conducted from the interface throughout the board.

When assembling components on the board, the electrical conductors are first coated with solder and the solder is coated with flux. The electrical components which are to be soldered are placed on the flux and the solder. The solder is reflowed by infrared radiation which is transmitted through the base to the radiation-absorbing interface, and there the radiation is converted to heat which flows by thermal conduction through the conductors and melts the solder. On withdrawal of the radiation and cooling of the solder, the components are permanently secured to the board. Since the components themselves are not directly exposed to the radiation there is little or no chance of their being damaged, and no shields are needed to protect them. Further, the radiation may be of a relatively low intensity because the interface efficiently converts the radiation to heat.

Further objects and advantages of the present invention will become apparent from the following detailed description and the accompanying figures of the drawing, in which.

Figures 1, 2, 3, 4, 5, 6, 7:
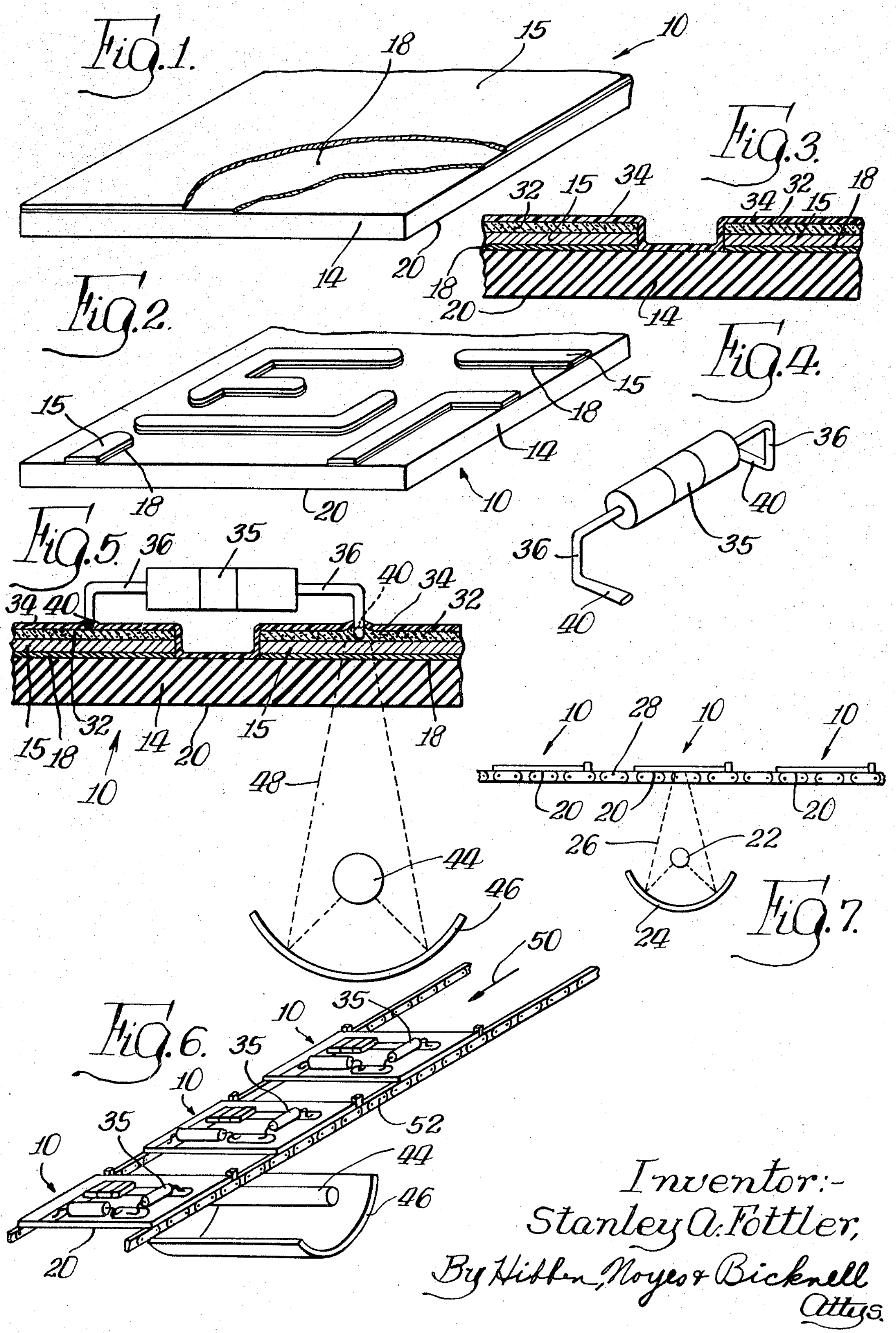
FIG. 1 is a perspective view of a circuit board for use with apparatus and method embodying the present invention.
FIG. 2 is a perspective view of the circuit board after forming of a conductor pattern.
FIG. 3 is a fragmentary enlarged elevation view of the circuit board after solder and flux coatings have been applied.
FIG. 4 is a perspective view of an electrical component which is to be soldered to the circuit board.
FIG. 5 is a fragmentary elevational view of a circuit board with an electrical component reflow soldered to the board.
FIG. 6 is a perspective view of mass reproduction apparatus for soldering circuit boards.
FIG. 7 is an elevational view of an infrared unit used to cure circuit boards.

In FIG. 1 is illustrated a unit or board 10 before a conductor pattern has been formed thereon. The board 10 includes a base 14 which can be of any shape to accomodate a particular conductor pattern. The base 14 may be formed from an insulating material such as epoxy or phenolic resin impregnated layers of paper. Such material has adequate structural strength and is essentially transparent to infrared radiation. Base materials having the foregoing properties are presently commercially available.

Secured to one side of the base 14 is a layer or sheet 15 of an electrically conductive metal such as copper, which may be applied to the board as by conventional electroplating or laminating technique.

Between the base 14 and the electrical sheet 15 is formed an infrared-absorbing interface 18. While the interface may be formed by various techniques such as roughing the surface of the base or the conductor to form a low reflective and a highly absorptive surface, or as by applying a dark metallic coating such as nickel or a dark oxide coating to the sheet or the board, the interface 18 is preferably provided by oxidizing the underside of the sheet 15 to form a copper oxide. The copper may be oxidized by a conventional heating process or by subjecting it to an acid bath. The interface 18 not only acts as a radiation-absorbing surface which converts infrared radiation to heat, it also promotes a firm bond between the electrical sheet 15 and the base 14.

When the sheet 15 has been formed onto the base 14 by electroplating, the bond strength between the electrical sheet 15 and the base 14 is increased by heating. Heretofore, such a curing process has been carried out in a baking furnace which heats the board 10. In accordance with the present invention, the board 10 is cured (FIG. 7) by exposing the bottom surface 20 of the board 10 to an infrared radiation source 22, such as a quartz lamp. Only one such lamp has been illustrated, it being understood that several of such lamp could be used. A reflector 24 having, for example, a gold-plated inner surface directs the radiation 26 to the board 20. The reflector 24 is focused to concentrate the radiation 26 in a particular area, and in the present instance it is focused on the interface 18 between the sheet 15 and the base 14. The rays 26 pass through the surface 20 and the base 14 and strike the interface 18. Since the base 14 is generally neither reflective nor absorptive but is transparent to infrared radiation, only a small part of the radiation is lost in passing through the base 14, and most of the radiation is transmitted to the interface 18, which is absorptive rather than reflective and transparent to infrared radiation. The infrared radiation is converted to heat by the interface 18 and the copper sheet 15, which is in intimate contact with the interface 18, heats the board 10 by thermal conduction. By this method most of the heat is transmitted directly to the area desired, which is the interface 18 between the conductor 15 and the base 14, thereby promoting firm bonding between the conductor 15 and the base 14. By transmitting infrared radiation through the base 14 to the interface 18 the desired curing can be accomplished in seconds rather than hours. For example, satisfactory curing has been accomplished by moving a printed circuit board through a ⅛ inch wide elongated beam of focused infrared radiation at the rate of 32 inches per minute. The boards 10 may be cured while being moved by an assembly line conveyor 28 over an infrared source as is shown in FIG. 7.

After the printed circuit board 10 has been cured, the sheet 15 is formed, for example by etching, into a conductor pattern, and the circuit or electric components are secured to the conductors. The upper surfaces of the electrical conductors are coated with solder 32 (FIGS. 3 and 5) as by a conventional wave soldering technique, and the conductors are then coated with rosin flux 34 which dries to a sticky or tacky consistency.

As is shown in FIG. 4, an electrical component 35, in this instance a resistor, has leads 36, the outer end portions thereof being bent to form feet 40. The component 35 is assembled on the board with the feet 40 thereof in the flux 34, and the tackiness of the flux 34 holds the component 35 on the conductor prior to soldering. The component 35 and the leads 36 are contained on the same side of the base 14 as is the conductor, and the leads 36 are soldered directly to the conductor. Consequently, no holes need be made in the base 14 for the leads. Thus, the step in conventional manufacturing processes, of punching or drilling holes in the base for the leads has been eliminated.

As is shown in FIG. 5, after the feet 40 of the leads 36 have been located in the flux 34 and on the solder 32, the solder is reflowed in order to electrically connect the leads to the conductors. The assembly is located over an elongated infrared source 44 (FIGS. 5 and 6) having a reflector 46 which focuses the radiation 48 on the board. The infrared radiation is similarly passed, as heretofore described, through the base 14 to the interface 18 where it is converted to heat. The conductor 15 being made of metal is more heat-conductive than the base 14, most of the heat flows by conduction through the conductor 15 to the solder 32, and remelts the solder. The leads of the electrical component 35 become soldered to the conductors upon cooling of the solder 32.

As shown in FIG. 6, a series of boards can be soldered while moving, as is indicated by the arrow 50, along a conveyor 52. The undersides 20 of the boards are exposed to the infrared radiation source 44. The width of the beam of the focused radiation and the rate of travel of the boards through the beam can be controlled to regulate the soldering time and the amount of heat applied. In a specific example, satisfactory soldering has been accomplished by passing printed circuit boards through a ⅛ inch wide beam of focused infrared radiation, the boards moving at the rate of from 8 to 16 inches per minute.

After the components 35 have been reflow soldered to the board, and the solder has cooled, the components may be further coated or encapsuled for protection as desired.

While infrared radiation has been described in connection with the present invention, it is to be understood that the inventor contemplates the uses of other portions of the electromagnetic spectrum with suitable interface and base materials.

I claim:

1. A method of forming a printed circuit board including a radiation transparent base on one side thereof, an electrical conductor, and a radiation-absorptive interface between said base and conductor, comprising the steps of:
   a. placing solder on said conductor;
   b. placing an electrical component on said solder;
   c. directing radiation through said base onto said interface, whereby said radiation is converted to heat which is conducted from said interface to said conductor for melting said solder; and
   d. cooling said solder whereby said component is secured to said conductor.

2. A method of forming a printed circuit board including a radiation transparent base on one side thereof, an electrical conductor, and a radiation-absorptive interface between said base and conductor, comprising the steps of:
   a. melting solder on said conductor;
   b. coating said conductor with flux;
   c. placing an electrical component on said flux-coated conductor while said flux is in a tacky state;
   d. directing infrared radiation through said base onto said interface, whereby said radiation is converted to heat which is conducted from said interface to said conductor for remelting said solder; and
   e. cooling said solder whereby said component is secured to said conductor.

3. A method of transferring heat to a printed circuit board including a radiation transparent base on one side thereof, an electrical conductor on the other side thereof, and a radiation-absorptive interface located between said base and said conductor, comprising the steps of:
   a. directing radiation on said one side;
   b. through said base; and
   c. onto said interface; whereby said radiation is converted to heat by said interface and transferred by conduction to the other portions of said board.

4. A method as in claim 3, comprising the additional steps, performed prior to step a, of:
   d. placing solder on said conductor; and
   e. placing an electrical component on said solder, whereby said heat is conducted from said interface to said conductor for melting said solder; and said component is secured to said conductor after said solder sets.

5. A method as in claim 4, comprising the additional step, performed prior to step e, of:
   g. bending the leads of the electrical component into feet which support said component above said conductor.

6. A method as in claim 4, comprising the additional steps, performed prior to step e, of:

h. coating said conductor with flux; and i. permitting said flux to become tacky, whereby said component is held in place by said flux prior to heating said interface.

7. A method as in claim 3, further comprising the step of non-selectively directing the radiation across substantially the entire base of said board.

8. A method as in claim 7, further comprising the steps of:

focusing the radiation into an elongated beam; and moving said board relative to and through said beam, whereby the amount of heat transferred is controlled by the rate of relative movement.

* * * * *